United States Patent
Kolman

(10) Patent No.: US 7,274,202 B2
(45) Date of Patent: Sep. 25, 2007

(54) CAROUSEL DEVICE, SYSTEM AND METHOD FOR ELECTRONIC CIRCUIT TESTER

(75) Inventor: Robert S. Kolman, Longmont, CO (US)

(73) Assignee: Verigy (Singapore) Pte. Ltd., Singapore (SG)

(*) Notice: Subject to any disclaimer, the term of this patent is extended or adjusted under 35 U.S.C. 154(b) by 0 days.

(21) Appl. No.: 11/246,487

(22) Filed: Oct. 7, 2005

(65) Prior Publication Data

US 2007/0080700 A1   Apr. 12, 2007

(51) Int. Cl.
   *G01R 31/26* (2006.01)
(52) U.S. Cl. .................... 324/765; 324/158.1
(58) Field of Classification Search ............. 324/158.1, 324/765

See application file for complete search history.

(56) References Cited

U.S. PATENT DOCUMENTS

| | | | | |
|---|---|---|---|---|
| 3,039,604 A | * | 6/1962 | Bickel et al. ................ 209/556 |
| 3,094,212 A | * | 6/1963 | Moore et al. ................ 209/548 |
| 5,070,297 A | * | 12/1991 | Kwon et al. ................ 324/754 |
| 5,404,111 A | * | 4/1995 | Mori et al. .................. 324/758 |
| 5,552,701 A |   | 9/1996 | Veteran et al. |
| 5,558,541 A |   | 9/1996 | Botka et al. |
| 5,822,717 A | * | 10/1998 | Tsiang et al. ................ 702/108 |
| 5,834,946 A | * | 11/1998 | Albrow et al. ............... 324/760 |
| 5,847,293 A | * | 12/1998 | Jones ......................... 73/865.8 |
| 6,078,187 A | * | 6/2000 | Hanners et al. ............. 324/761 |
| 6,137,303 A | * | 10/2000 | Deckert et al. ............. 324/765 |
| 6,160,410 A | * | 12/2000 | Orso et al. .................. 324/757 |
| 6,246,251 B1 | * | 6/2001 | Gallagher ................... 324/765 |
| 6,249,342 B1 | * | 6/2001 | Cheng ...................... 356/237.2 |
| 6,364,089 B1 | * | 4/2002 | Singh et al. ................ 198/408 |
| 6,404,218 B1 | * | 6/2002 | Le et al. ..................... 324/763 |
| 6,479,777 B2 | * | 11/2002 | Yamakawa .................. 209/574 |
| 6,507,203 B1 | * | 1/2003 | Hirschmann ................ 324/754 |
| 6,517,691 B1 | * | 2/2003 | Bluck et al. ............ 204/298.25 |
| 6,756,778 B2 |   | 6/2004 | Hirschmann |
| 2006/0022664 A1 | * | 2/2006 | Hill ......................... 324/158.1 |

* cited by examiner

*Primary Examiner*—Ha Tran Nguyen
*Assistant Examiner*—Arleen M. Vazquez

(57) ABSTRACT

A rotatable or translatable carousel configured to facilitate electrical or electronic testing of Devices Under Test (DUTs) in combination with an insertion handler and a test head is disclosed. The carousel is configured to be placed on a test head of a tester in a first position with a first Device under Test (DUT) (such as a system-on-a-chip (SOC) integrated circuit (IC)) loaded in a first test position of the carousel. A first electrical or electronic test is performed on the first DUT at the first position, after which the carousel is advanced to a second position and a second DUT is loaded in a second test position of the carousel. While the carousel is positioned at the second position, the first test is performed on the second DUT and a second electrical or electronic test is performed on the first DUT. In one embodiment, the process of testing DUTs, inserting DUTs and rotating or translating the carousel in respect of the test head is repeated until all test positions in the carousel have been filled and all desired electrical or electrical tests have been performed on the first DUT. At this point the process of removing fully-tested DUTs from the carousel is optimally undertaken.

7 Claims, 9 Drawing Sheets

Existing DUT Board Approach

Pipeline / Carousel Testing Approach

*Time Saved !!!*

CAROUSEL DEVICE, SYSTEM AND METHOD FOR ELECTRONIC CIRCUIT TESTER

FIELD OF THE INVENTION

This invention relates to the field of devices, systems and methods for testing electronic circuits by applying and measuring electrical signals, and more particularly to carousel devices, systems and methods for testing system-on-a-chip (SOC) or other integrated circuits.

BACKGROUND

To ensure proper functionality and reliability, manufacturers typically test SOC integrated circuits (ICs) before shipping SOC ICs to customers. One system commonly employed to test SOC ICs is the Agilent 93000 SOC Tester, which supports concurrent tests. Portions of the Agilent 93000 SOC Tester are described in U.S. Pat. No. 6,756,778 to Hirschmann entitled "Measuring and/or calibrating a Test Head;" U.S. Pat. No. 5,558,541 to Botka et al. entitled "Blind Mate Connector for an Electronic Circuit Tester;" and U.S. Pat. No. 5,552,701 to Veteran et al. entitled "Docking System for an Electronic Circuit Tester."

As illustrated in FIG. 1, the Agilent 93000 Tester 100 comprises test head 110 with DUT (Device under test) interface 120, manipulator 130 for positioning test head 110, DUT board 150 which plugs into underlying DUT interface 120, support rack 140 for supplying test head 110 with electrical power, cooling water and compressed air (not shown in the Figures) and a computer workstation (not shown in the Figures) which serves as the user interface to Tester 100.

Test head 110 is an important component in the system and comprises tester electronics and additional analog modules. Test head 110 may be configured with 512 pins or 1024 pins. The 512 pin test head supports 4 card cages while the 1024 pin test head supports 8 card cages. Each card cage can contain 8 digital boards or 8 analog modules, respectively. A single board has 16 pins, making 128 pins per cage. Therefore, the 4-cage test head contains 512 pins and the 8-cage test head 1024 pins. The DUT is mounted on DUT board 150, which is connected to the I/O channels by DUT interface 120. DUT interface 120 consists of high performance coax cabling and spring contact pins (pogo pins) which establish electrical connection with DUT board 120.

DUT interface 120 provides docking capabilities to handlers and wafer probers. The docking mechanism is controlled by compressed air (not shown in the Figures), and if required may also be operated manually. Test head 110 is water-cooled and receives its cooling water supply from support rack 140, which in turn is connected by two flexible hoses to the cooling unit (not shown in the Figures).

General-purpose manipulator 130 supports and positions test head 110. Manipulator 130 provides 6 degrees of freedom for precise and repeatable connections between test head 100 and handlers or wafer probers.

Support rack 140 is attached to manipulator 130 and serves as the interface between test head 110 and AC power, cooling water and compressed air. Tester 100 may also comprise additional support racks such as analog support racks for installing additional analog instruments.

An HP-UX workstation (not shown in the Figures) may serve as the interface between the user and tester 100. At the present time, Agilent 93000 SOC Series SmarTest software runs on the HP-UX workstation under the HP-UX operating system, although other suitable operating systems such as Linux or other workstations may certainly be used. SmarTest allows setups and test data to be downloaded to the test system, and further permits editing of such information. All testing is carried out in the test system. Results are read back by the workstation and displayed on the monitor. During test program execution, upload and download are typically not required since the test processors act independently from the workstation once the test program has begun running.

On the workstation, a diagnostic program can be run to check the system periodically or to identify the source of a problem. Configuration of Tester 100 involves assigning digital channel boards, power supplies, and analog instruments to specific channels of the test head and providing for associated mainframe components (such as an alternate master clock (AMC)) external to the test head.

Test head electronics components supply power to the various DUTs and perform measurements. Some test head functions and key elements are as follows:
DC/DC conversion and distribution of supply voltages
Interfacing via fiber optical cable to the workstation
Internal communication via data bus, address bus, and control bus
Communication clock generation and distribution
Master clock generation and distribution
High precision parametric measurement unit (HPPMU)
Interfacing to external clock
Supplying power to the DUT
Making channel measurements Each pin in the platform provides period, timing, levels, patterns and sequencing, enabling each tester pin to independently operate in any number of different modes. Instead of sharing testing resources, every pin supports a full range of tester modes including clock, SCAN, BIST-control, functional, APG, and digital source and capture.

Such flexibility in Tester 100 allows for on-the-fly grouping of pins into virtual ports to test target IP blocks. As a result, the platform is capable of testing multiple blocks concurrently. Once a test has been completed, tester pins may be immediately reconfigured and assembled into new port configurations to conduct a completely different set of tests.

The architecture of Tester 100 provides support for concurrent tests on potentially dozens of ports with different sequencing and digital data rates. The test-processor-per-pin architecture of Tester 100 allows it to function as a scalable platform. Tester 100 supports test technologies that include RF, analog, digital and mixed signal, each fully capable of being used concurrently.

FIG. 2 illustrates the placing of DUT 160 on packaged parts DUT board 150, and the positioning of DUT board 150 above test head 110.

As shown in FIG. 3, instead of employing packaged parts DUT board 150 of FIG. 2, where DUT 160 is placed directly on DUT board 150, wafer prober DUT board 155 is placed on top of DUT interface 120. Several further components are then stacked atop wafer prober DUT board 155: pogo tower 165, probe card 180 and wafer 190. DUT board 155, stiffener assembly 170 and pogo tower 165 together form a Wafer Prober Interface (WPI), which is made in two sizes: a 9.5" WPI and a 12" WPI. A WPI DUT board (small or large, corresponding to 512 or 1024 pins) connects the pogo pins of the test head electronics to the pogo pins of pogo tower 165. It also maps the rectangular pogo pin layout of the test head to the circular contact layout of the pogo tower probe card. A standard DUT board provided by Agilent contains an EEPROM that identifies the board. Customized WPI DUT boards may have different pin mapping, connect several pins, or provide relays and filter circuits.

System-on-a-chip ICs that are to be tested on Tester 100 are loaded one-by-one into test head 110, or one-by-one into DUT board 150 inserted into test head 110. Electronic tests are then performed on each of the SOC ICs, after the completion of which the SOC ICs are removed one-by-one from test head 110 or DUT board 150 plugged into test head 110. While SOC ICs are being inserted into or removed from test head 110 or DUT board 150, no electronic testing of ICs occurs.

It will now be seen that reducing the amount of time required per DUT to load and unload DUTS into or from test head 110 or DUT board 150 will result in a reduction of the amount of time, and therefore the cost required, to test SOC ICs. What is needed is an SOC IC electronic circuit tester requiring less time to test SOC ICs, and to load and unload same from test head 110 or DUT board 150.

SUMMARY OF THE INVENTION

In accordance with one aspect of the present invention, a rotatable or translatable carousel is provided that facilitates electrical or electronic testing of Devices Under Test (DUTs). The carousel functions in combination with an insertion handler and a test head.

In one embodiment of a carousel of the present invention, the carousel comprises an upper surface, a lower surface configured for releasable attachment to the test head in a plurality of carousel positions and means for individually accepting and retaining a plurality of DUTs in individual test stations disposed in the upper surface of the carousel. The carousel further comprises one test station for each DUT that is to be accepted, retained and tested therein, as well as means for electrically connecting individual DUTs accepted and retained in the carousel to corresponding electrical contacts in the test head. The carousel is adapted to be rotated or translated in respect of the test head such that each test station may be positioned in a plurality of positions respecting the test head.

In another embodiment of the present invention, the above-described carousel is incorporated into a tester comprising a test head having an upper surface comprising a plurality of electrical contacts or connections disposed thereon or therein and an insertion handler. Other components may be included in such a system, including a manipulator, a support rack, a workstation and appropriate software for programming and controlling the system.

The present invention further includes within its scope a method of electrically or electronically testing Devices under Test (DUTs) with a tester having the above-described carousel and test head and insertion handler. The method comprises using the insertion handler, inserting a first untested DUT in a first test position of the carousel while the carousel is operably engaged in a first position on the tester head; releasing the insertion handler from the first DUT and moving the handler to fetch a second untested DUT; performing a first electrical or electronic test on a first portion of the first DUT; disengaging the carousel from the test head and rotating or translating same to a second position of the test head; operably engaging the carousel with the test head at the second position of the test head; using the insertion handler to insert a second DUT in a second test position of the carousel; and performing a first electrical or electronic test on a first portion of the second DUT; performing a second electrical or electronic test on a second portion of the first DUT.

The various embodiments of the carousel of the present invention reduce mechanical time delays, and therefore reduce costs associated with, prior art means and methods of loading SOCs or other ICs in testers such as the Agilent 93000 tester. Such reduced time delays result from a higher percentage of SOCs or other ICs being tested over a given amount of time in respect of prior art testers.

BRIEF DESCRIPTIONS OF THE DRAWINGS

The foregoing and other aspects of the invention will become apparent after having read the detailed description of a preferred embodiment of the invention set forth below and after having referred to the following drawings, in which like reference numerals refer to like parts:

DETAILED DESCRIPTION OF PREFERRED EMBODIMENTS

As employed in the specification and claims hereof, the term "carousel" means a detachable, moveable and translatable mechanism for accepting and holding a plurality of DUTs and/or SOCs while electrical and/or electronic tests are being performed on such DUTs and/or SOCs, the carousel being operably connectable to a test head 110 of a tester 100. The term "electrical and/or electronic testing" means electrical and/or electronic tests carried out by machines having capabilities similar to the Agilent 93000 Tester described hereinabove.

Figure 1:
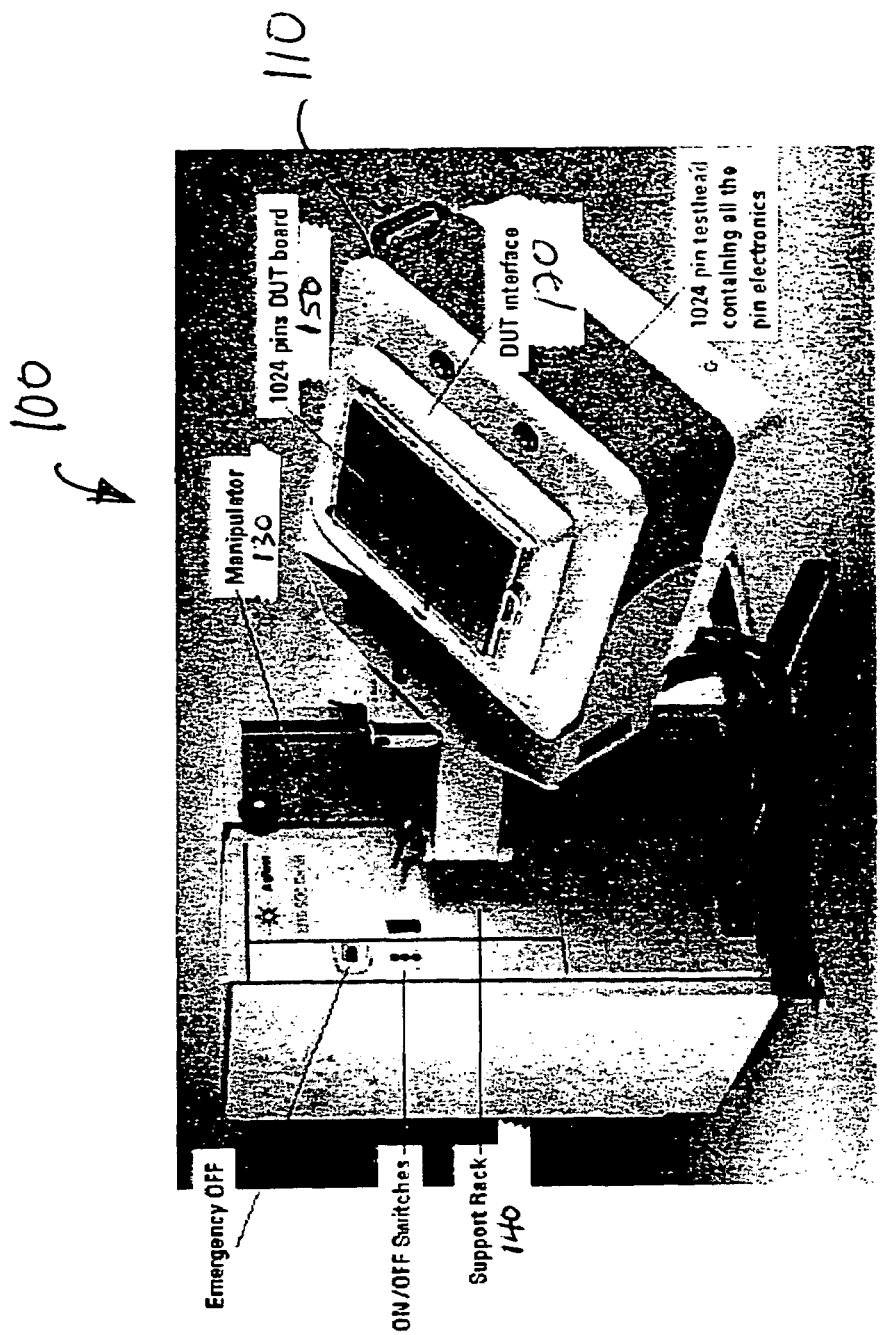
FIG. 1 shows a prior art Agilent 93000 SOC Tester.
Figure 2:
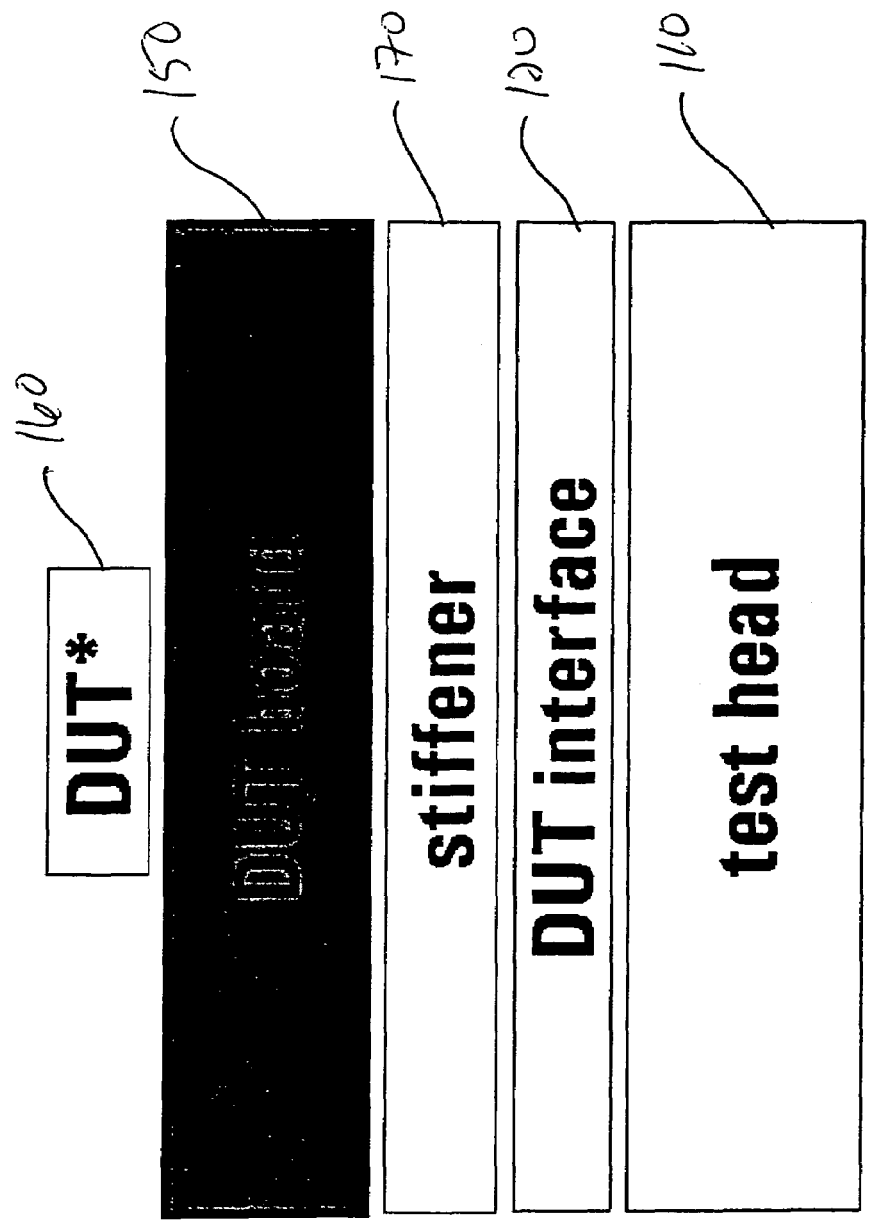
FIG. 2 shows a schematic cross-section of prior art DUT and DUT board connections to a test head of an Agilent 93000 SOC Tester.
Figure 3:
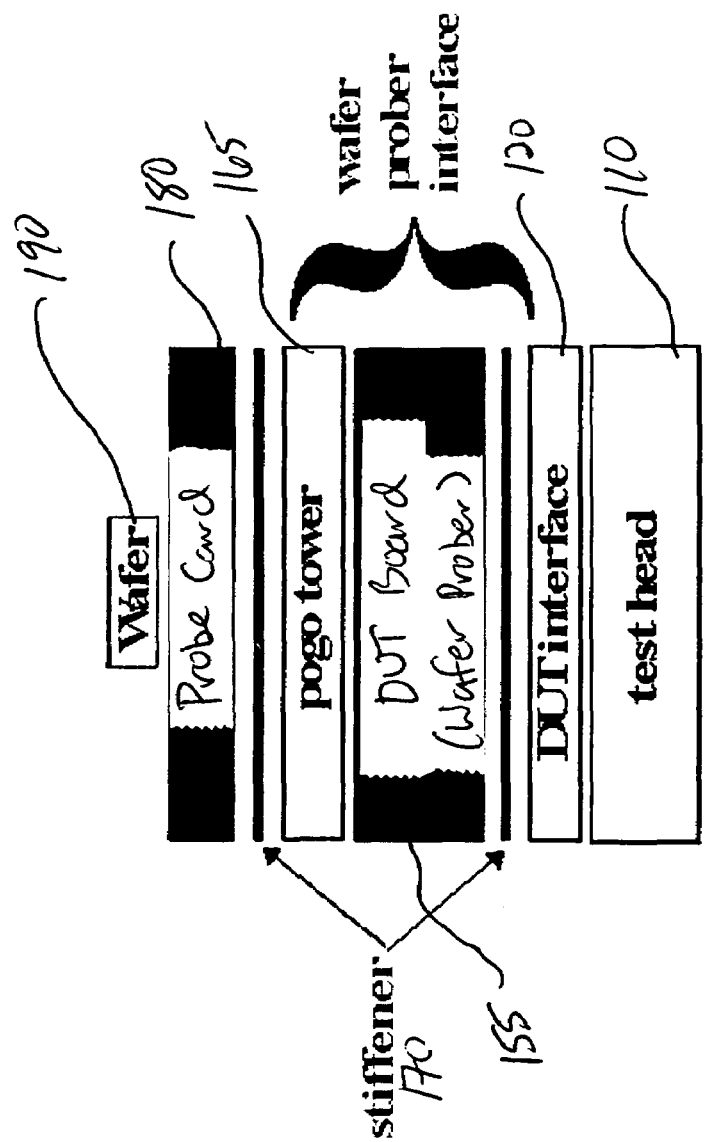
FIG. 3 shows a schematic cross-section of prior art wafer, probe card and DUT interface connections to a test head of an Agilent 93000 SOC Tester.
Figure 4A:
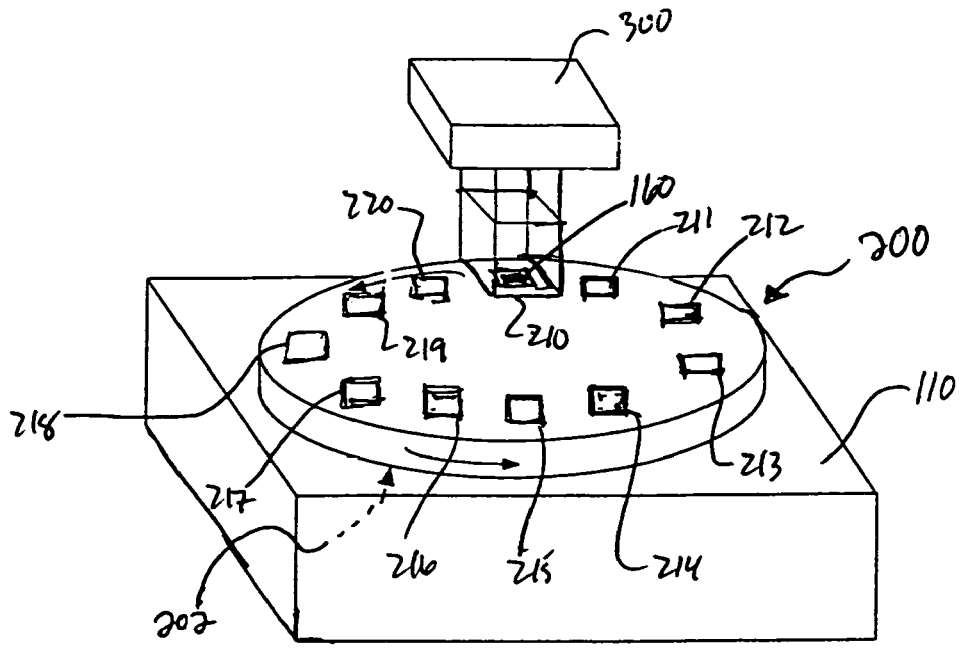
FIG. 4a shows one embodiment of a rotatable circular carousel and a corresponding insertion handler of the present invention in a first position.
Figure 4B:
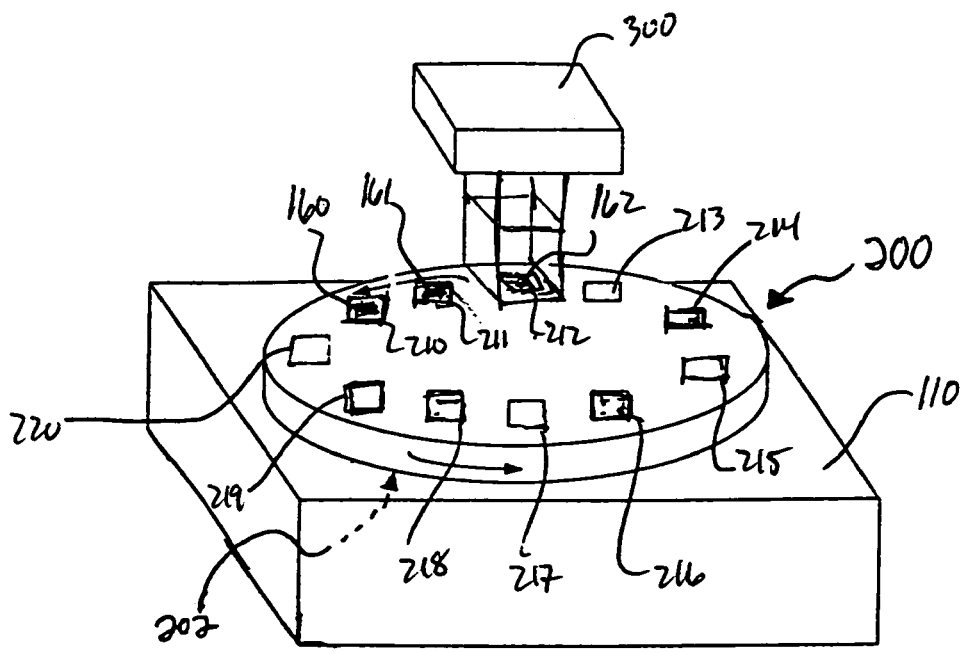
FIG. 4b shows the carousel and insertion handler of FIG. 4a in a second position.

FIG. 4a shows one embodiment of a rotatable circular carousel and a corresponding insertion handler of the present invention in a first position, while FIG. 4b shows the carousel and insertion handler of FIG. 4a in a second position. When carousel 200 is in the first position illustrated in FIG. 4a, only first DUT 160 has been loaded in test station 210 of carousel 200. FIG. 4b illustrates carousel 200 after it has advanced to third test station 212 and has loaded third DUT 162 therein. Continuing to refer to FIGS. 4a and 4b, it will be seen that carousel 200 is configured to permit the loading and unloading of DUTs 160 through 170 into test positions 210 through 220 according to the following sequence of events:

(a) Insertion handler 300 inserts first DUT 160 in first test position 210 of carousel 200.

(b) Insertion handler 300 releases DUT 160 and moves to fetch second DUT 161;

(c) While insertion handler 300 is fetching second DUT 161, electrical and/or electronic tests are performed on one or more portions of DUT 160;

(d) Carousel 200 and DUT 160 mounted thereon are together lifted upwardly away from test head 110 such that electrical pins or contacts disposed on the underside of carousel 200 on contactor base 202 and/or DUT interface 120 located therebeneath disengage and are pulled upwardly out of or away from test head 110.

(e) Carousel 200 is rotated through an angular displacement such that electrical pins, contacts or holes on contactor base 202 and/or DUT interface 120 corresponding to first test position 210 and first DUT 160 are appropriately aligned vertically with underlying corresponding electrical pins, contacts and/or holes disposed in test head 110.

(f) Suitable means are employed to push carousel 200 downwardly towards test head 110 such that electrical pins, contacts and/or holes disposed on the underside of carousel 200 on contactor base 202 and/or DUT interface 120 disposed therebeneath operably engage and/or are inserted into or onto corresponding appropriate electrical contacts, pin holes or slots disposed in or on test head 110.

(g) Insertion handler 300 inserts second DUT 161 in second test position 211 of carousel 200.

(h) Insertion handler 300 releases second DUT 161 and moves to fetch third DUT 162;

(i) While insertion handler 300 is fetching third DUT 162, electrical and/or electronic tests are performed on one or more portions of DUTs 160 and 161.

(j) Carousel 200 and DUTs 160 and 161 mounted thereon are together lifted upwardly away from test head 110 such that electrical pins or contacts disposed on the underside of carousel 200 on contactor base 202 and/or DUT interface 120 located therebeneath disengage and are pulled upwardly out of or away from test head 110.

(k) Carousel 200 is rotated through an angular displacement such that electrical pins, contacts or holes on contactor base 202 and/or DUT interface 120 located therebeneath corresponding to first and second DUTs 160 and 161 are appropriately aligned vertically with underlying corresponding electrical pins, contacts and/or holes disposed in test head 110.

(l) Suitable means are employed to push carousel 200 downwardly towards test head 110 such that electrical pins, contacts and/or holes disposed on the underside of carousel 200 on contactor base 202 and/or DUT interface 120 located therebeneath operably engage and/or are inserted into or onto corresponding appropriate electrical contacts, pin holes or slots disposed in or on test head 110.

(m) Insertion handler 300 inserts third DUT 162 in third test position 212 of carousel 200.

(n) Insertion handler 300 releases third DUT 162 and moves to fetch fourth DUT 163;

(o) While insertion handler 300 is fetching fourth DUT 163, electrical and/or electronic tests are performed on one or more portions of DUTs 160, 161 and 162.

(p) Steps (j) through (n) are repeated for each new DUT loaded onto carousel 200, and are repeated until all available or desired test positions 210 through 220 have been filled with DUTs 160 through 170.

(q) Once all available or desired test positions 210 through 220 have been filled with DUTs, DUTs that have been completely tested electrically and/or electronically begin to rotate into the position located directly beneath insertion handler 300. Such completely tested DUTs are removed sequentially to make room for new untested DUTs to be inserted into carousel 200.

(r) Once all DUTs that are to be tested have been inserted into carousel 200, carousel 200 is rotated through all test positions required for the last DUT inserted into carousel 200 to be fully tested and to permit removal of such DUT by insertion handler 300.

Note that several different embodiments or modifications of the present invention, in addition to those described above, fall within the scope of the present invention. Such embodiments and modifications include, but are not limited to, testers 100 and components of testers 100 that are configured as describe below.

Insertion handler 300 may be configured to move/insert/remove from more than one test position on carousel 300.

Multiple insertion handlers 300 may be employed for each carousel 200, or multiple carousels may be employed for a single insertion handler 300. For example, and in reference to FIG. 8, a first insertion handler 300 may be employed to insert untested DUT 168 in test position 218 while second insertion handler 301 may be employed to remove fully tested DUT 169 from test position 219.

The order in which operations are carried out on DUTs and carousels 200 may differ from that described above. For example, one DUT may be tested while another DUT is being inserted in carousel 200.

In one preferred embodiment of the present invention, insertion handler 300 and test head 110 are operably attached to tester 100 of the prior art described hereinabove. Depending on the particular application at hand, electrical and/or electrical tests need not be run on all DUTs at all test positions. Carousels 200 of the present invention may include more or fewer test positions than those shown in FIG. 4. A plurality of carousels 200 and corresponding insertion handlers 300 may employed simultaneously or sequentially to occupy the same or different portions of test head 110.

As shown in FIGS. 5-8, the test stations 210-225 disposed in the surfaces of the carousels 200 are positioned interior to the peripheries of the carousels 200 (i.e., the test stations 210-225 do not extend to the peripheries, or edges, of the carousels 200). Of note, however, the carousels 200 of the present invention need not be circular in shape, and indeed may assume square, rectangular, octagonal, pentagonal or other shapes amenable to rotational or translational deployment and testing of DUTs 160.

In one embodiment of the present invention, carousel 200 is rotated through an angular distance approximating (360 degrees)/(number of DUTs to be loaded in carousel 200). Other embodiments of the present invention will be characterized in having different angular rotations at each step Carousel 200 may be configured to rotate horizontally, vertically or at any angle therebetween in respect of test head 110. Alternatively, test head 110 and carousel 200 may be configured such that the major axes of both units are substantially parallel and horizontal, vertical or at any angle therebetween.

Means known to those skilled in the art, such as those currently employed in the prior art Agilent 93000 tester, may be employed to mechanically lift, rotate and push down carousel 200. For example, carousel 200 may be lifted upwardly, rotated through an angular displacement and/or pushed downwardly by insertion handler 300 or by any other suitable electrical, mechanical, electro-mechanical, pneumatic or other means capable of accurately and precisely at least one of lifting, rotating and/or pushing down carousel 200. Note that multiple or different means may be employed to perform each of the foregoing functions, or that one means may be employed to perform two or more of such functions.

Tester 100 of the present invention, while comprising carousel 200 and corresponding test head 110, may further be configured to operate as a wafer prober and tester in a manner similar to the Agilent 93000 Tester.

In one embodiment of the present invention, it is contemplated that DUTs be electrically and/or electronically tested such that different tests be carried out on different portions of each DUT at each test position. Thus, and by way of example only, at a first test position a memory portion of an SOC might be tested, at a second test position a wireless communication portion of the SOC might be tested, at a third test position a CPU portion of the SOC might be tested, at a fourth test position an input/output portion of the SOC might be tested, and at a fifth test position an analog-to-digital portion of the SOC might be tested.

Figure 5:
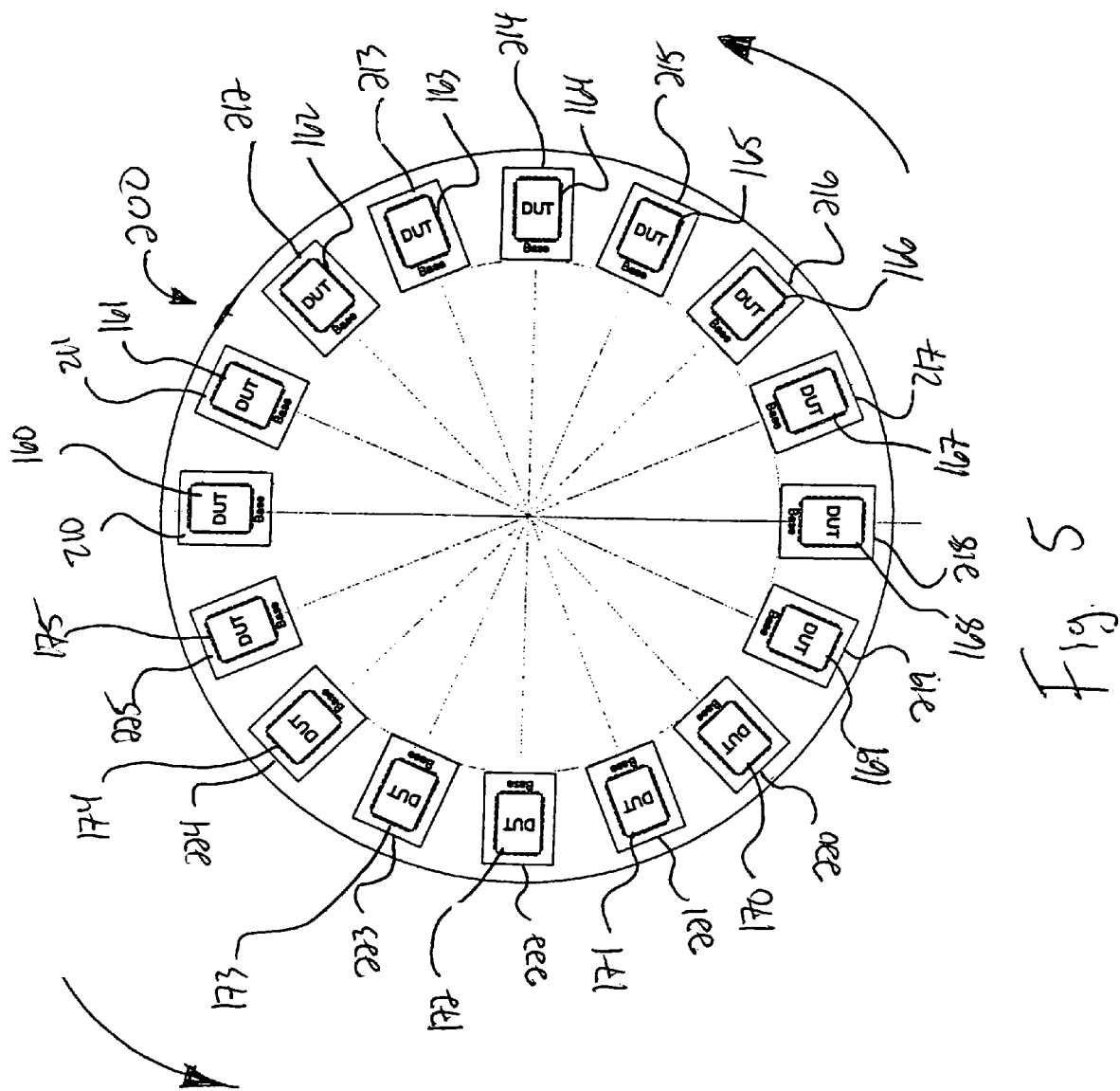
FIG. 5 shows a plan view of one embodiment of a rotatable circular carousel of the present invention for an electronic circuit tester.

FIG. 5 shows a plan view of one embodiment of circular carousel 200 of the present invention for tester 100. Unlike the eleven-test position embodiment of carousel 200 illustrated in FIG. 4, carousel 200 in FIG. 5 comprises 16 different test positions 210 through 225 capable of accommodating 16 different DUTs and/or SOCs 160 through 175.

Figure 6:
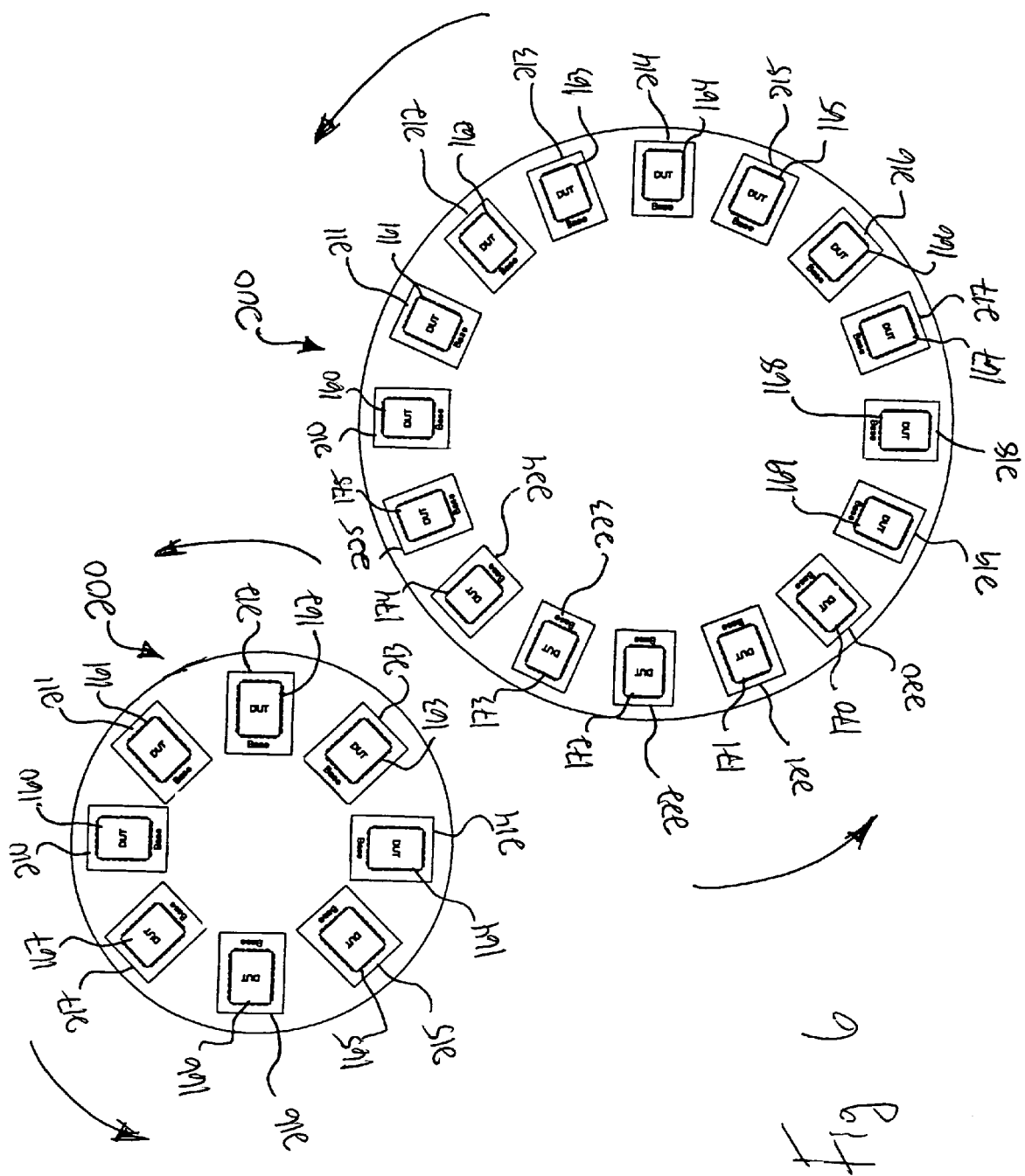
FIG. 6 shows plan views of two different embodiments of rotatable circular carousels of the present invention for electronic circuit testers.

FIG. 6 shows plan views of two different embodiments of carousels 200 of the present invention for testers 100. The first embodiment located in the upper left portion of FIG. 6 contains 8 test stations 210 through 217 capable of accommodating 8 DUTs 160 through 167. The second embodiment located in the lower right portion of FIG. 6 contains 26 test stations 210 through 225 capable of accommodating 26 DUTs 160 through 175. FIG. 6 is intended to illustrate that the size and capacity of carousels 200 of the present invention are hardly restricted to a single configuration and may contain any of a number of test stations 1 through n, the number n being determined by the number of pins required to test each DUT, the radius of carousel 200, the size of the DUTs to be tested and the size and particular configuration of test head 110 and other factors.

Figure 7:
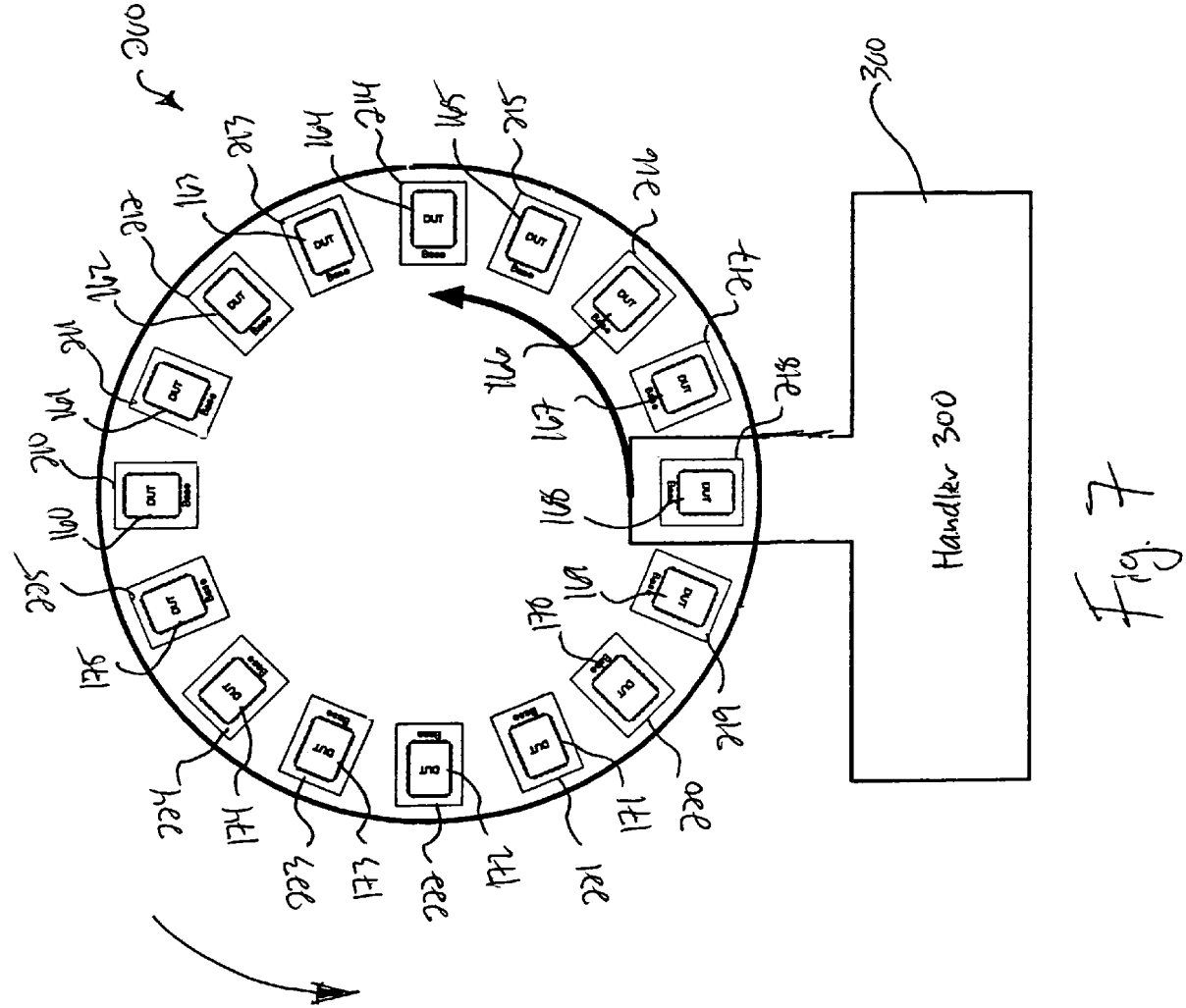
FIG. 7 shows a plan view of one embodiment of a rotatable circular carousel of the present invention for an electronic circuit tester, where DUTs are loaded and unloaded from a single position.
Figure 8:
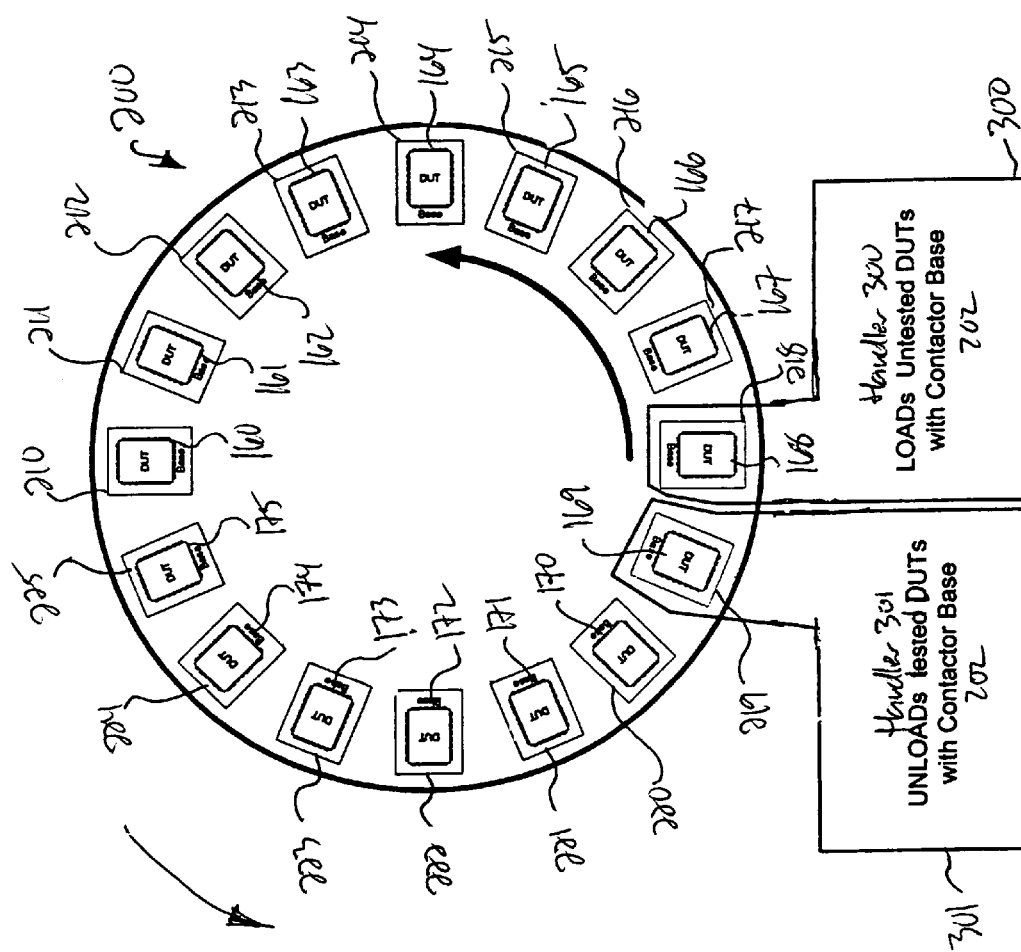
FIG. 8 shows a plan view of one embodiment of a rotatable circular carousel of the present invention for an electronic circuit tester, where DUTs are loaded and unloaded from separate positions.

FIG. 7 shows a plan view of one embodiment of carousel 200 of the present invention for tester 100, where DUTs 160 through 175 are loaded and unloaded from a single position by means of single insertion handler 300. FIG. 8 shows a plan view of another embodiment of carousel 200 of the present invention for tester 100, where untested DUT 168 is loaded in test position 218 of carousel 200 by insertion handler 300 while DUT 169 is unloaded from test position 219 of carousel 200 by insertion handler 301.

Figure 9:
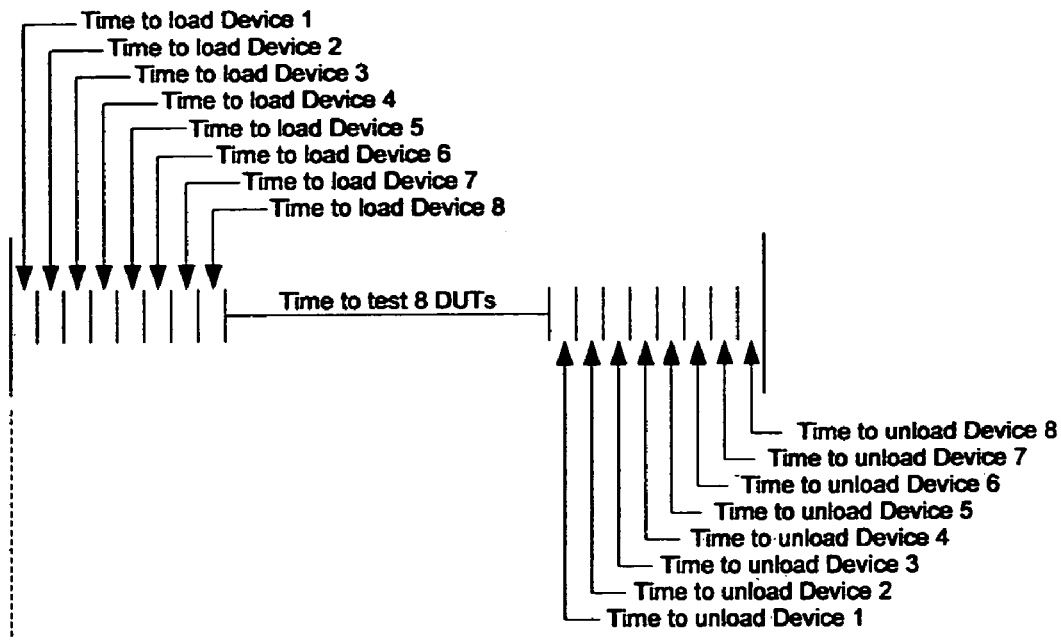
FIG. 9 illustrates time savings created by a carousel of the present invention in respect of a prior art DUT board approach.
Figure 9:
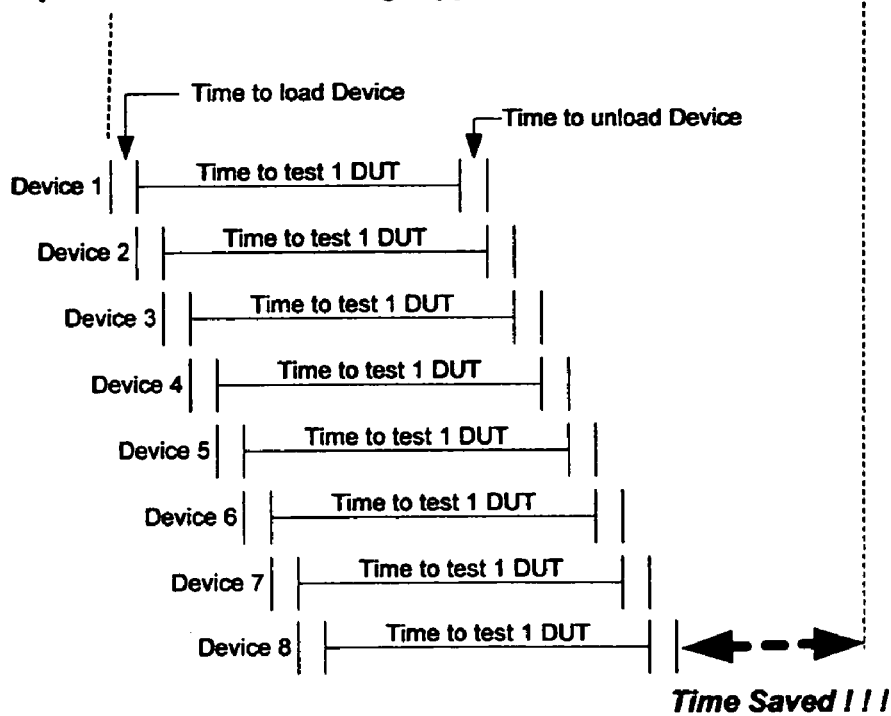

FIG. 9 illustrates an example of time savings accruing from the use of carousel 200 of the present invention. In the example shown in FIG. 9, a conventional prior art DUT board approach is compared to the use of carousel 200 of the present invention, where the DUT board and carousel 200 are both contain 8 test positions. As illustrated in FIG. 9 by the respective amounts of time required to load, test and unload each of the 8-position DUT board and carousel 200, carousel 200 reduces significantly the amount of time required for the same processes to be carried out using a DUT board of the prior art.

As will now become apparent, while specific embodiments of carousel 200, test head 110 and tester 100 are described and disclosed herein, many variations and alternative embodiments of the present invention may be constructed or implemented without departing from the spirit and scope of the present invention. It is to be understood, therefore, that the scope of the present invention is not to be limited to the specific embodiments disclosed herein, but is to be determined by looking to the appended claims and their equivalents. Consequently, changes and modifications may be made to the particular embodiments of the present invention disclosed herein without departing from the spirit and scope of the present invention as defined in the appended claims.

I claim:

1. Apparatus to facilitate electrical or electronic testing of Devices Under Test (DUTs), comprising:
    a rotatable or translatable carousel having,
        an upper surface configured to be accessed by a insertion handler;
        a plurality of test stations disposed in, and interior to the periphery of, the upper surface of the carousel, wherein each of the test stations is configured to accept individual ones of a plurality of DUTs that are inserted in and removed from the test stations by the insertion handler;
        a lower surface configured for releasable attachment to a test head, in a plurality of carousel positions, as the carousel is rotated or translated;
        means disposed on the lower surface of the carousel for, as the carousel is rotated or translated to different ones of the plurality of carousel positions, electrically connecting i) different ones of the test stations to ii) different test positions on the test head.

2. The apparatus of claim 1, further comprising:
    the test head, the test head having an upper surface with a plurality of different test positions, wherein each test position has electrical contacts or connections disposed thereon or therein, wherein the electrical contacts or connections are configured to make electrical contact with the means for electrically connecting i) different ones of the test stations to ii) different test positions on the test head, and wherein the test head is positioned adjacent the lower surface of the carousel; and
    the insertion handler, positioned adjacent the upper surface of the carousel.

3. The apparatus of claim 2, wherein the insertion handler is a first insertion handler, and wherein the apparatus further comprises a second insertion handler, the first handler being configured for inserting DUTs in the carousel, and the second insertion handler being configured for removing DUTs from the carousel.

4. The apparatus of claim 1, wherein the carousel is configured for rotation through a series of discrete predetermined angular displacements, each such angular displacement approximating (360 degrees)/(number of test stations disposed in the upper surface of the carousel).

5. The apparatus of claim 1, wherein the carousel is one of circular, multi-sided, square, rectangular, pentagonal, hexagonal and octagonal in shape.

6. The apparatus of claim 1, wherein the DUTs the carousel is configured to accept are integrated circuits (ICs).

7. The apparatus of claim 6, wherein the ICs the carousel is configured to accept are system-on-a-chip (SOC) integrated circuits.

* * * * *